United States Patent
Hotta et al.

(10) Patent No.: US 7,561,094 B2
(45) Date of Patent: Jul. 14, 2009

(54) SEQUENTIAL COMPARISON-TYPE AD CONVERTER HAVING SMALL SIZE AND REALIZING HIGH SPEED OPERATION

(75) Inventors: Masao Hotta, Tokorozawa (JP); Tatsuji Matsuura, Tokyo (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 11/889,620

(22) Filed: Aug. 15, 2007

(65) Prior Publication Data
US 2008/0106453 A1 May 8, 2008

(30) Foreign Application Priority Data
Nov. 8, 2006 (JP) .............................. 2006-303111

(51) Int. Cl.
H03M 1/38 (2006.01)
(52) U.S. Cl. ....................................... 341/161; 341/155
(58) Field of Classification Search ................. 341/172, 341/155, 161, 162
See application file for complete search history.

(56) References Cited

U.S. PATENT DOCUMENTS

| 4,326,192 A | * | 4/1982 | Merrill et al. | ............... 341/172 |
| 4,940,981 A | * | 7/1990 | Naylor et al. | ............... 341/161 |
| 5,786,783 A | * | 7/1998 | Hasegawa | ................... 341/172 |
| 6,380,881 B2 | | 4/2002 | Harada et al. | |
| 2008/0068245 A1 | * | 3/2008 | Kuramochi et al. | ......... 341/155 |

FOREIGN PATENT DOCUMENTS

| JP | 10-209870 | 8/1998 |
| JP | 2002-26731 | 1/2001 |

OTHER PUBLICATIONS

Sagara Iwao, "Introduction to A/D D/A Converters($2^{nd}$ Edition)", Nikkan Kogyo Shimbunsha, pp. 116-117, Mar. 31, 2003.
Yoshinaga Jun (supervised by Shoda Eisuke), "Alte-21 Analog Circuit", Ohm Co., pp. 111-114, Jun. 25, 1998.
D. Johns et al, "Analog Integrated Circuit Design", John Wiley & Sons, Inc., pp. 492-493, etc., 1997.
Office Action mailed Sep. 9, 2008 and issued in corresponding Japanese Patent Application No. 2006-303111.

* cited by examiner

*Primary Examiner*—Brian Young
(74) *Attorney, Agent, or Firm*—Staas & Halsey LLP

(57) ABSTRACT

An analog-to-digital converter has a digital-to-analog converter, first, second and third comparators, and a sequential comparison register and control logic circuit. The digital-to-analog converter produces analog signals, the first, second and third comparators compare the input analog signal with first, second and third analog signals which are different from each other. Further, the sequential comparison register and control logic circuit controls the digital signals that are fed to the digital-to-analog converter from the first to third comparators, and outputs the digital signals as digital values obtained by subjecting the input analog signals to the analog-to-digital conversion.

8 Claims, 17 Drawing Sheets

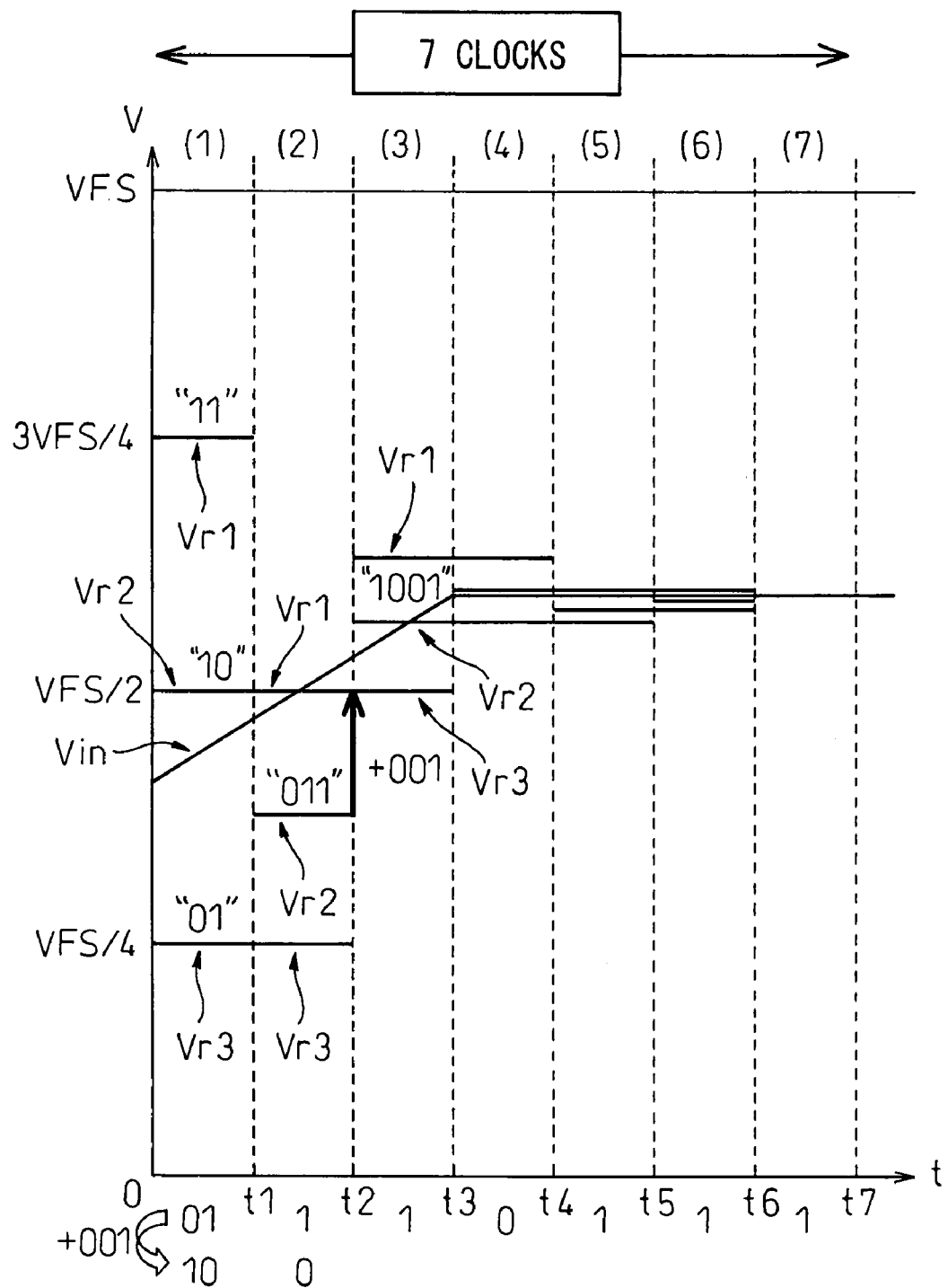

A>B>C

| RESULTS OF COMPARISON WITH A | RESULTS OF COMPARISON WITH B | RESULTS OF COMPARISON WITH C | E | F |
|---|---|---|---|---|
| 0 | 0 | 0 | 1 | 1 |
| 0 | 0 | 1 | 1 | 0 |
| 0 | 1 | 1 | 0 | 0 |
| 1 | 1 | 1 | 0 | 1 |

| RESULT OF COMPARISON WITH A | RESULT OF COMPARISON WITH B | RESULT OF COMPARISON WITH C | E | F | F' | D1 | D2 |
|---|---|---|---|---|---|---|---|
| 0 | 0 | 0 | 1 | 1 | 1 | 0 | 0 |
| 0 | 0 | 1 | 1 | 0 | 0 | 0 | 1 |
| 0 | 1 | 1 | 0 | 0 | 1 | 1 | 0 |
| 1 | 1 | 1 | 0 | 1 | 0 | 1 | 1 |

| RESULT OF COMPARISON WITH A | RESULT OF COMPARISON WITH B | RESULT OF COMPARISON WITH C | E | F | D3 | a |
|---|---|---|---|---|---|---|
| 0 | 0 | 0 | 1 | 1 | 0 | 1 |
| 0 | 0 | 1 | 1 | 0 | 0 | 0 |
| 0 | 1 | 1 | 0 | 0 | 1 | 0 |
| 1 | 1 | 1 | 0 | 1 | 1 | 1 |

Fig.17
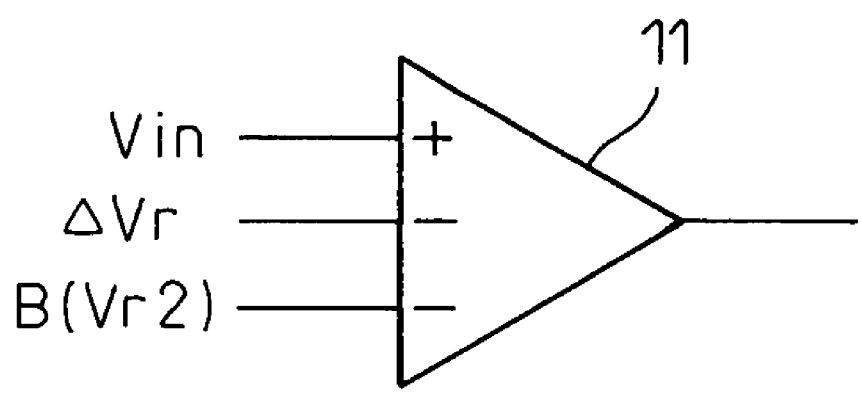
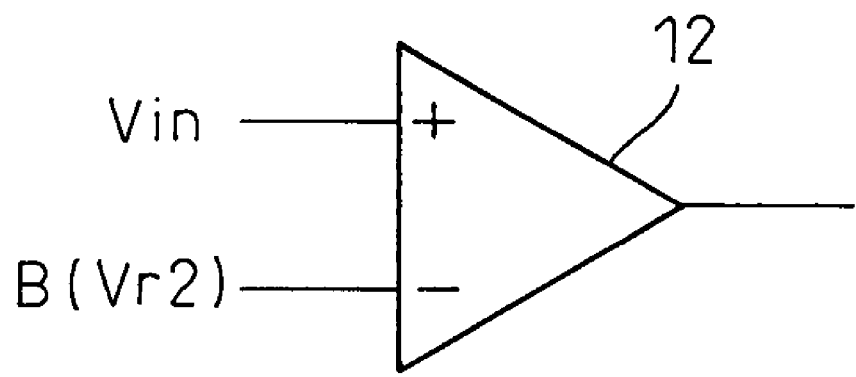
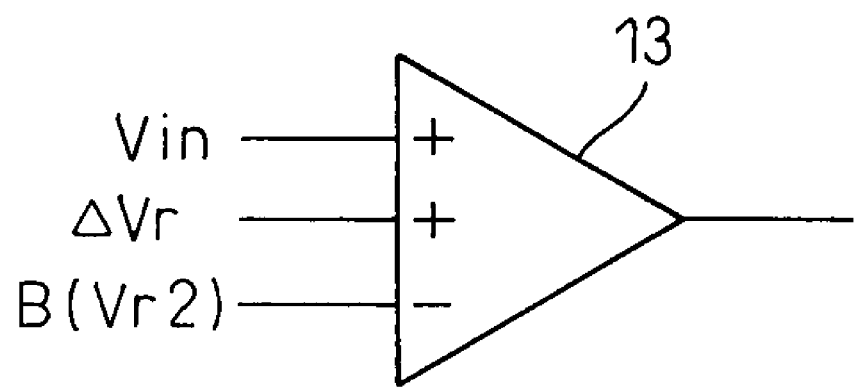

SEQUENTIAL COMPARISON-TYPE AD CONVERTER HAVING SMALL SIZE AND REALIZING HIGH SPEED OPERATION

CROSS REFERENCE TO RELATED APPLICATION

This application is based upon and claims the benefit of priority from the prior Japanese Patent Application No. 2006-303111, filed on Nov. 8, 2006, the entire contents of which are incorporated herein by reference.

BACKGROUND OF THE INVENTION

1. Field of the Invention

The present invention relates to an analog-to-digital converter and, more particularly, to a sequential comparison-type analog-to-digital converter.

2. Description of the Related Art

In the prior art, a plurality of analog-to-digital converters (AD converters: ADCs) mounted on, for example, microcomputers and system LSIs are those of the sequential comparison type from the standpoint of decreasing the sizes yet maintaining high precision.

Sequential comparison registers and control logic circuits, DA converters and sequential comparison-type AD converters equipped with a comparator have heretofore been disclosed in a variety of documents such as Sagara Iwao, "Introduction to A/D•D/A Converters (2nd Edition)", Nikkan Kogyo Shimbunsha, Mar. 31, 2003, pp. 116-117; Yoshinaga Jun (supervised by Shoda Eisuke), "Alte-21 Analog Circuit", Ohm Co., Jun. 25, 1998, pp. 111-114; D. Johns et al, "ANALOG INTEGRATED CIRCUIT DESIGN", John Wiley & Sons, Inc., 1997, pp. 492-493, etc.

The prior art and its associated problems will be described in detail later with reference to accompanying drawings.

SUMMARY OF THE INVENTION

An object of the present invention is to provide a sequential comparison-type AD converter capable of operating at a high speed. Another object of the present invention is to provide an AD converter in a small size by increasing the allowance of process fluctuation and relative dispersion of elements.

According to the present invention, there is provided an analog-to-digital converter comprising a digital-to-analog converter producing analog signals; first, second and third comparators comparing the input analog signal with first, second and third analog signals which are different from each other; and a sequential comparison register and control logic circuit which controls the digital signals that are fed to the digital-to-analog converter from the first to third comparators, and outputs the digital signals as digital values obtained by subjecting the input analog signals to the analog-to-digital conversion.

The digital-to-analog converter may form the first to third analog signals. The first analog signal may be greater than the second analog signal by a predetermined level, and the third analog signal may be smaller than the second analog signal by the predetermined level. The predetermined level may be a voltage level one-half the weight of the bit of a digital signal applied to the digital-to-analog converter.

The digital-to-analog converter may form the second analog signal and a differential analog signal of a voltage level one-half the weight of the bit of a digital signal applied to the digital-to-analog converter at the time of forming the second analog signal. The first comparator may compare a signal obtained by adding the differential analog signal to the second analog signal with the input analog signal; the second comparator may compare the second analog signal with the input analog signal; and the third comparator may compare a signal obtained by subtracting the differential analog signal from the second analog signal with the input analog signal.

The sequential comparison resister and control logic circuit may further include a comparator output signal processing circuit which processes the output signals of the first to third comparators to convert them into signals of 2 bits.

The sequential comparison resister and control logic circuit may further include a ring counter counting clock signals and outputting a count signal; and a sequential comparison-type AD conversion logic circuit which receives output signals from the first to third comparators and an output signal from the ring counter, and forms a digital signal to be fed to the digital-to-analog converter.

The sequential comparison-type AD conversion logic circuit may include an AD conversion logic circuit sequentially comparing the upper two bits that specify the digital signals of the upper two bits; an AD conversion logic circuit sequentially comparing the intermediate bits that specify the digital signals of the intermediate bits of the third and subsequent bits but one bit before the least significant bit; and an AD conversion logic circuit sequentially comparing the least significant bits that specify the digital signals of the least significant bits.

The sequential comparison-type register and control logic circuit may further include a correction circuit which corrects the digital signals by using the digital signals of the upper two bits formed by the AD conversion logic circuit sequentially comparing the upper two bits, by using the digital signals of the intermediate bits formed by the AD conversion logic circuit sequentially comparing the intermediate bits, and by using the digital signals for correction.

BRIEF DESCRIPTION OF THE DRAWINGS

The present invention will be more clearly understood from the description of the preferred embodiments as set forth below with reference to the accompanying drawings, wherein:

FIG. 7 is a diagram (part 2) for illustrating the operation of the analog-to-digital converter shown in FIG. 5;

FIG. 17 is a circuit diagram illustrating a modified example of the comparators in the analog-to-digital converter shown in FIG. 8A.

DESCRIPTION OF THE PREFERRED EMBODIMENTS

Before describing in detail the preferred embodiments of the present invention, a conventional analog-to-digital converter and its associated problems will be described with reference to FIGS. 1 to 4.

Figure 1:
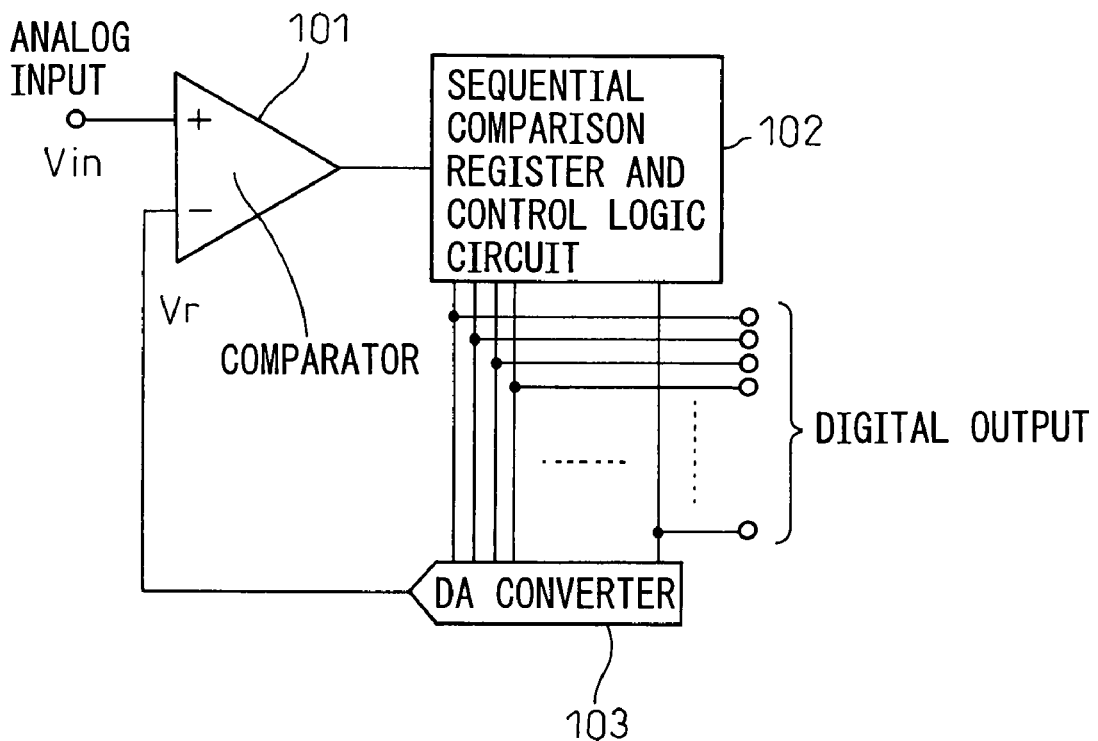
FIG. 1 is a block diagram illustrating a conventional analog-to-digital converter.
Figure 2:
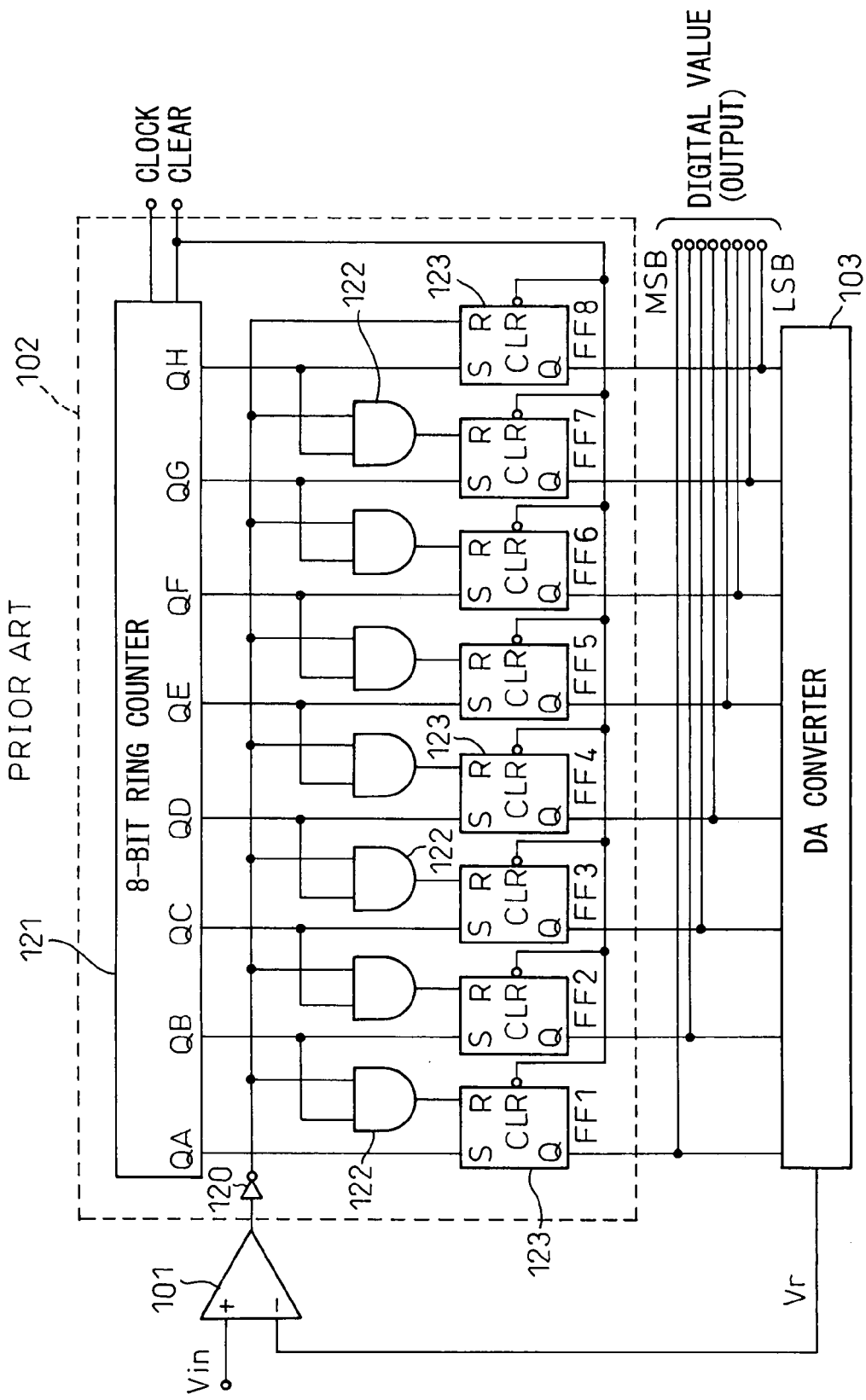
FIG. 2 is a block diagram schematically illustrating the circuit constitution of the analog-to-digital converter shown in FIG. 1.

FIG. 1 is a block diagram illustrating a conventional analog-to-digital converter, and FIG. 2 is a block diagram illustrating the circuit constitution of the analog-to-digital converter shown in FIG. 1, i.e., illustrating a conventional sequential comparison-type AD converter.

Referring to FIG. 1, the conventional sequential comparison-type AD converter includes a comparator 101, a sequential comparison register and control logic circuit 102, as well as a DA converter (digital-to-analog converter) 103. The input analog signal is input via, for example, a sample-holding circuit.

Referring to FIG. 2, the sequential comparison register and control logic circuit 102 includes, for example, an inverter 120, an 8-bit ring counter 121, a plurality of (seven) AND gates 122 that receive output signals from the comparator 101 and output signals from the ring counter 121, and a plurality of (eight) flip-flips (SR flip-flops FF1 to FF8) that produce AD-converted outputs (digital values).

The sequential comparison-type AD converter sequentially sets the inputs of the internal DA converter 103 relying upon the most significant bit (MSB), compares the output (reference voltage Vr) of the DA converter 103 with the input analog signal (input voltage Vin) through the comparator 101, and brings the reference voltage Vr close to the input voltage Vin. An input digital value of the DA converter that gives the reference voltage Vr closest to the input voltage Vin becomes a digital value (output) that is obtained by subjecting the input voltage Vin to the analog-to-digital conversion.

As described with reference to FIGS. 1 and 2, the conventional sequential comparison-type AD converter includes the comparator 101, sequential comparison resister and control logic circuit 102, and DA converter 103, and outputs the input digital value of the DA converter 103 that gives the output (reference voltage Vr) of the DA converter 103 closest to the input voltage Vin as a digital value that is obtained by subjecting the input voltage Vin to the analog-to-digital conversion.

Figure 3:
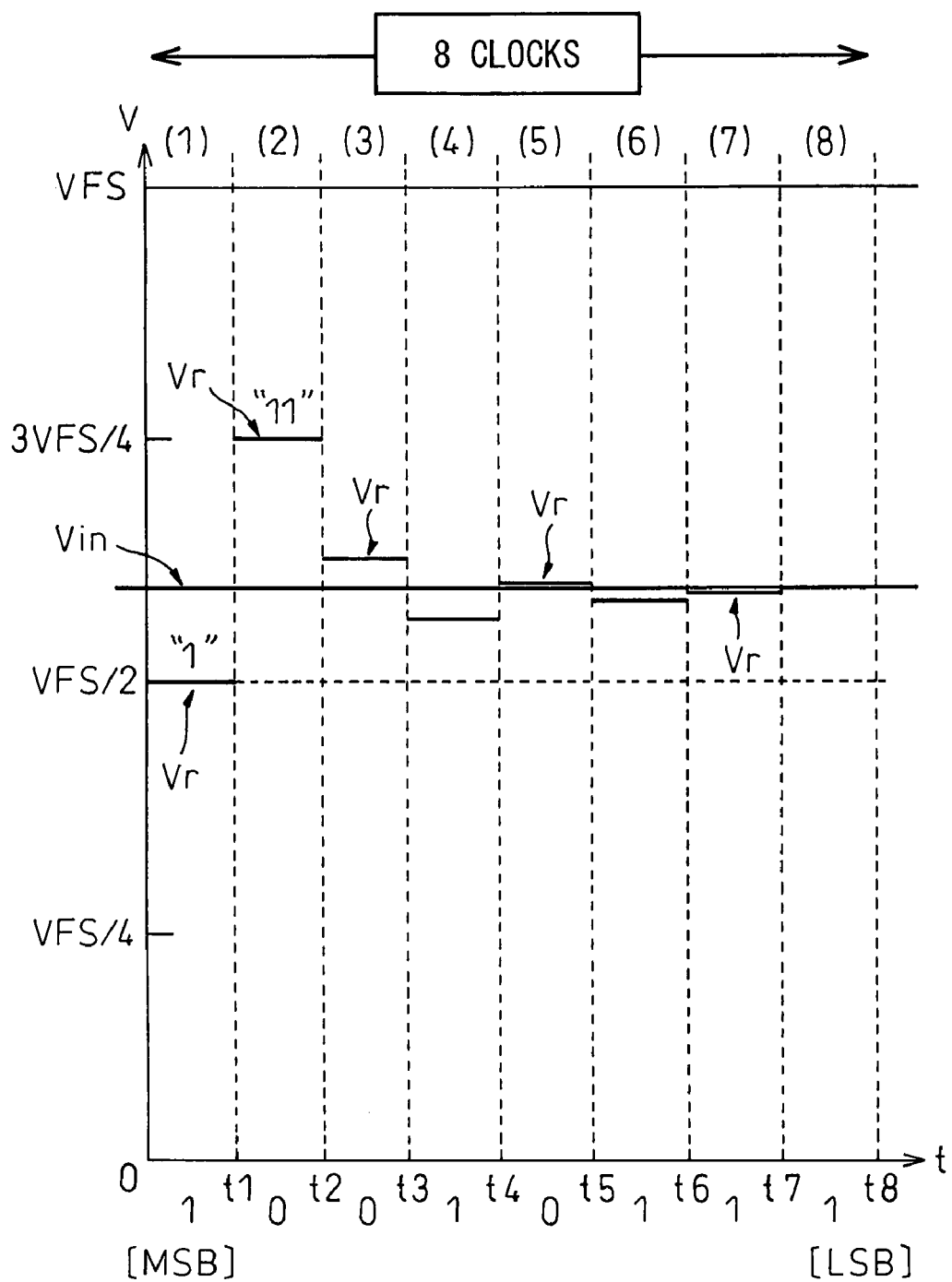
FIG. 3 is a diagram (part 1) for illustrating the operation of the analog-to-digital converter shown in FIG. 1.
Figure 4:
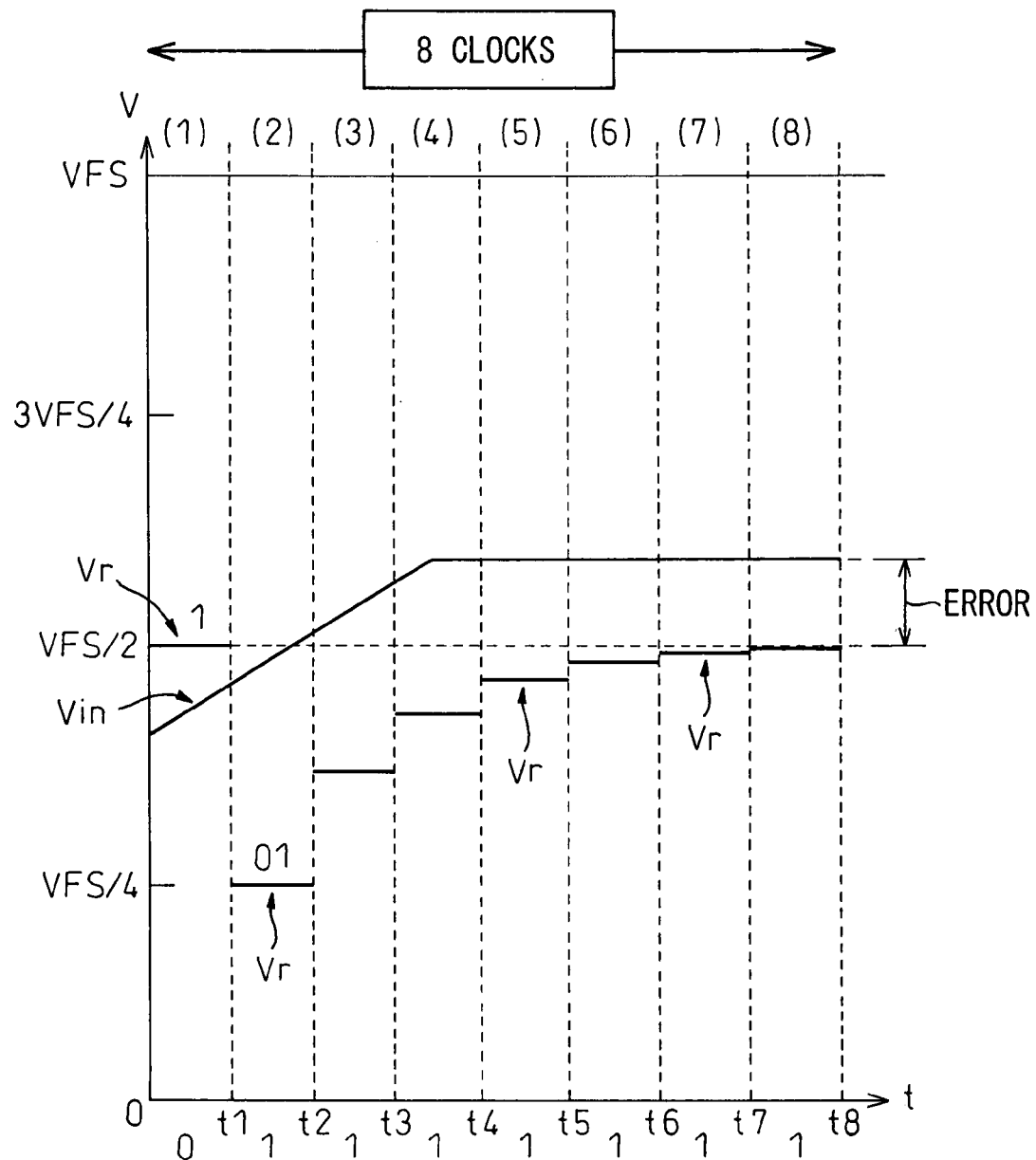
FIG. 4 is a diagram (part 2) for illustrating the operation of the analog-to-digital converter shown in FIG. 1.

FIGS. 3 and 4 are diagrams for illustrating the operation of the analog-to-digital converter shown in FIG. 1, and show processing for obtaining AD-converted digital outputs of 8 bits. FIG. 3 shows a normal case (no error is generated) and FIG. 4 shows a case where an error is generated. In FIGS. 3 and 4, Vin denotes an input voltage of an input analog signal, Vr denotes an output (reference voltage) of the DA converter 103, and VFS denotes a full-scale voltage.

In the normal case as shown in FIG. 3, a digital signal of the internal DA converter 103 is so set with an initial clock (1) that the most significant bit (MSB) only becomes "1", the reference voltage Vr is set to be VFS/2, and the input voltage Vin is compared with the reference voltage Vr through the comparator 101 at a timing t1.

If the input voltage Vin is decided to be larger than VFS/2, the MSB is allowed to remain ("1"), the next bit (second bit from the MSB) is set with the second clock (2) to be "1" ("11"), and the input voltage Vin is compared with the output (reference voltage Vr=3VFS/4) of the DA converter 103 at that moment through the comparator 101 at a timing t2.

If the input voltage Vin at the initial clock (1) is decided to be smaller than the reference voltage Vr (=VFS/2), the MSB (most significant bit) is set to be "0", the next bit (second bit from the MSB) is set with the second clock (2) to be "1" ("01"), and the input voltage Vin is compared with the output (reference voltage Vr=VFS/4) of the DA converter 103 at that moment through the comparator 101 at a timing t2.

The above processing is repeated up to the least significant bit ((LSB) whereby the reference voltage Vr becomes closest to the input voltage Vin, and the digital input value to the DA converter 103 at that moment becomes a digital value (output) obtained by subjecting the input analog signal (input signal) Vin to the digital conversion.

In the case of FIG. 3, the input voltage Vin is larger than VFS/2 and the most significant bit is set to be "1". Further, since the input voltage Vin is smaller than 3VFS/4, the second bit is set to be "0" ("10"), and the similar processing is repeated to obtain a digital value (output) "10010111".

According to the conventional sequential comparison-type AD converter, however, error may occur in the decision unless the comparison is effected by the comparator 101 after the input voltage and the output (reference voltage Vr) of the DA converter 103 have been settled sufficiently. Once error occurs in the decision of the comparator 101, the correction is impossible and a large conversion error results.

That is, referring to FIG. 4, the input voltage Vin may, for example, gradually acquire a predetermined level with given rising characteristics. In this case, if the input voltage Vin is compared with the output (reference voltage Vr=VFS/2) of the DA converter at a timing t1 in the way of rising and an error occurs in the result of comparison, i.e., if the comparator 101 decides that the input voltage Vin is smaller (MSB is "0") than the reference voltage Vr (=VFS/2), then a large error results even if the subsequent processing is normally executed.

Concretely, even when the digital output that is subjected to the AD conversion is correctly "10010111", an error in the decision of MSB may result in the production of "01111111". An error in the decision by the comparator 101 affects not only the rising (breaking) characteristics (settling time) of the input signal but also affects the rising (breaking) characteristics (settling time) of the reference voltage Vr which is the output of the DA converter 103 and noise. According to the prior art, therefore, the comparison by the comparator 101 must be done after the input voltage Vin and the output (reference voltage Vr) of the DA converter 103 have been settled to a sufficient degree, hindering the effort for increasing the speed of the sequential comparison-type AD converter.

In recent years, AD converters that operate at higher speeds have been strongly demanded in a variety of applications such as personal computers, digital still cameras and in engine control systems for automobiles.

In the sequential comparison-type AD converter as described above, however, the settling time of outputs of the internal DA converter becomes a bottleneck against the operation at high speeds. There still remains a problem that must be solved; i.e., error occurs in the conversion if the output is compared with the input signal in a state of not settled to a sufficient degree. Further, the problem of the settling time imposes limitation on the allowance of process fluctuation and relative dispersion of elements, causing the sequential comparison-type AD converter to become bulky. The principle of the analog-to-digital converter of the present invention will be described next prior to describing in detail the embodiment of the analog-to-digital converter of the present invention.

Figure 5:
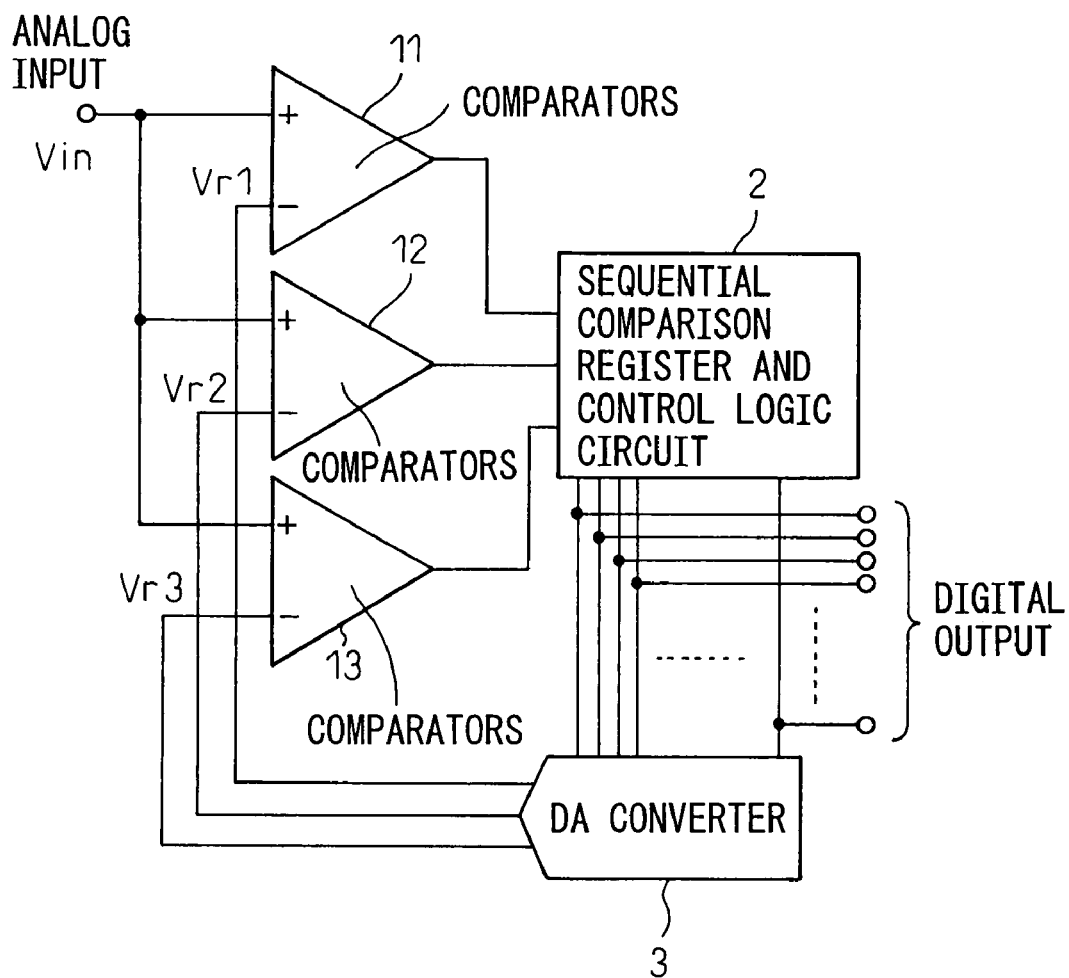
FIG. 5 is a block diagram illustrating the principle and constitution of the analog-to-digital converter according to the present invention.

FIG. 5 is a block diagram illustrating the principle and constitution of the analog-to-digital converter according to the present invention, and shows the AD converter of the sequential comparison type of the invention.

Referring to FIG. 5, the sequential comparison-type AD converter of the invention includes three comparators 11, 12 and 13, a sequential comparison register and control logic circuit 2, as well as a DA converter (digital-to-analog converter) 3. The input analog signal is input via, for example, a sample-holding circuit in a conventional manner.

The DA converter 3 produces analog signals (reference voltages) Vr1 to Vr3 of three different levels. That is, the first comparator 11 compares an input analog signal (input voltage) Vin that is fed with the first reference voltage Vr1, the second comparator 12 compares the input signal Vin with the second reference voltage Vr2, and the third comparator 13 compares the input signal Vin with the third reference voltage Vr3.

Here, the second reference voltage Vr2 corresponds to the reference voltage Vr in the conventional AD converter described with reference to FIGS. 1 to 4. The first reference voltage Vr1 is higher than the second reference voltage Vr2 (e.g., VFS/2) by a voltage (VFS/4) which is one-half the weight (resolution voltage: VFS/2) of the most significant bit (MSB) of the digital signal given to the DA converter 3, or is of a level (3VFS/4) higher by the weight (VFS/4) of the second bit next of MSB. The third reference voltage Vr3 is of a level (VFS/4) lower than the second reference voltage Vr2 (e.g., VFS/2) by a voltage one-half the weight of the MSB of the digital signal given to the DA converter 3.

Figure 6:
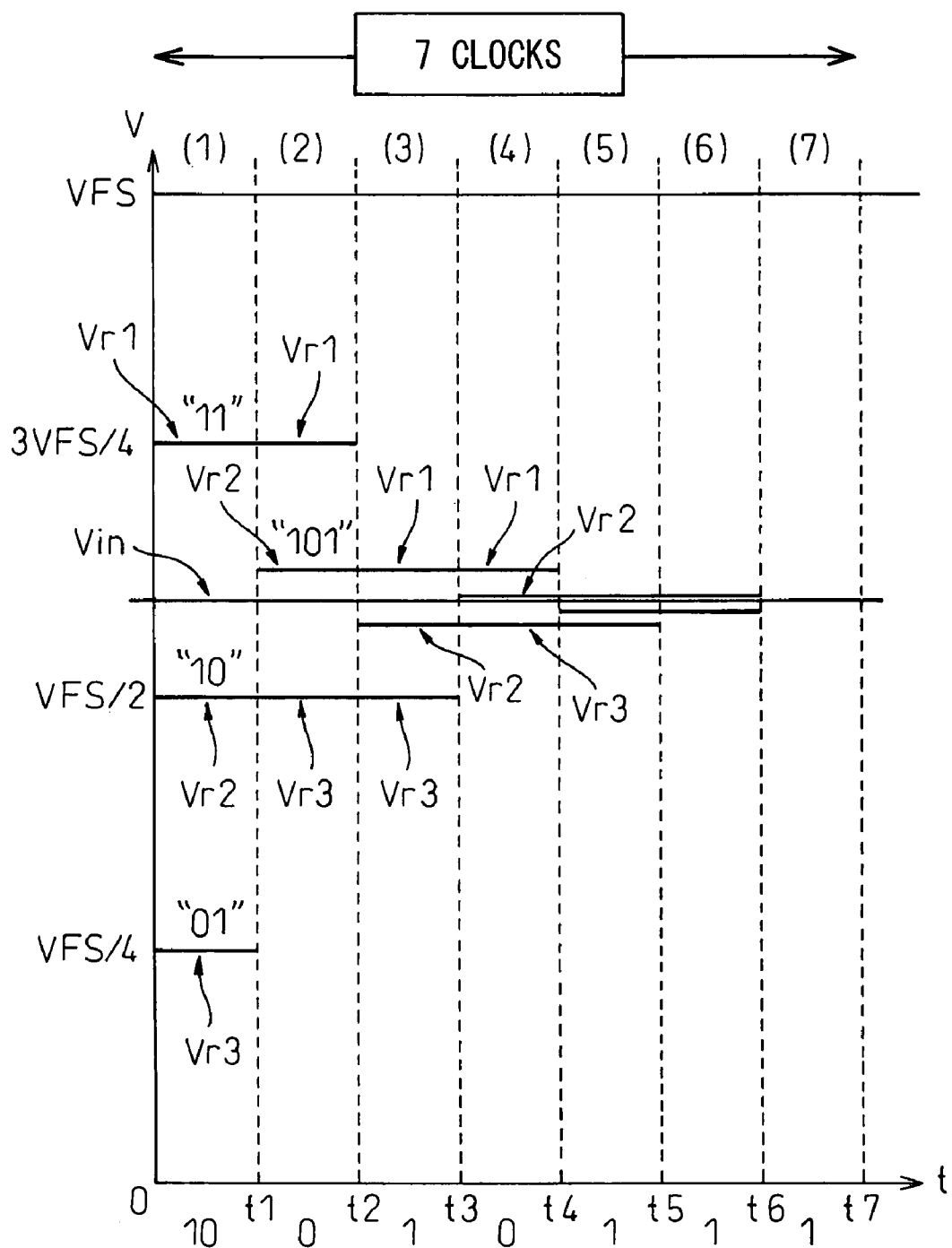
FIG. 6 is a diagram (part 1) for illustrating the operation of the analog-to-digital converter shown in FIG. 5.

FIGS. 6 and 7 are diagrams for illustrating the operation of the analog-to-digital converter shown in FIG. 5, and show processes for obtaining AD-converted digital outputs of 8 bits. FIG. 6 shows a normal case (no error is generated) and FIG. 7 shows a case where an error is generated. In FIGS. 6 and 7, Vin denotes a voltage of an input analog signal, Vr1 to Vr3 denote outputs (reference voltages) of the DA converter, and VFS denotes a full-scale voltage.

In the normal case as shown in FIG. 6, the internal DA converter 3 produces reference voltages of three levels, i.e., Vr1=3VFS/4, Vr2=VFS/2 and Vr3=VFS/4 with the first clock (1), and the comparators 11 to 13 compare the reference voltages Vr1 to Vr3 with the input analog signal (input voltage) Vin.

The three comparators 11 to 13 compare the input voltage Vin with the three reference voltages Vr1 to Vr3, and recognize in which region sectionalized by the reference voltages Vr1 to Vr3 the input voltage Vin is lying. Thus, the upper two bits (MSB and the next bit) are determined.

Referring to FIG. 6, if it is decided by the comparators 11 to 13 at a timing t1 that the input voltage Vin lies between the first reference voltage Vr1 (=3VFS/4) and the second reference voltage Vr2 (=VFS/2), then the upper two bits become "10". Or, if the input voltage Vin is decided to be lying between the second reference voltage Vr2 (=VFS/2) and the third reference voltage Vr3 (=VFS/4), then the upper two bits become "01". If, for example, the input voltage Vin is decided to be greater than the first reference voltage Vr1 (=3VFS/4), then the upper two bits become "11" and if the input voltage Vin is decided to be smaller than the third reference voltage Vr3 (=VFS/4), then the upper two bits become "00".

With the next clock (2), an output (5VFS/8) of the DA converter 3 corresponding to ("101") obtained by adding a bit "1" having a weight of a next bit (weight of the third bit: VFS/8) to the digital value decided with the preceding clock (1), is used as the second reference voltage Vr2.

That is, if the digital value ("1" or "0") of the n-th bit from the MSB is denoted by bn, and the weight of bn by qn, then the second reference voltage Vr2(n) can be expressed as, $$Vr2(1)=b1\cdot q1$$

$$Vr2(2)=b1\cdot q1+b2\cdot q2$$

$$Vr2(3)=b1\cdot q1+b2\cdot q2+b3\cdot q3$$

...

$$Vr2(n)=b1\cdot q1+b2\cdot q2+\ldots+bn\cdot qn$$

...

Further, Vr1(n) can be expressed as Vr1(n)=Vr2(n)+q(n+1). Moreover, Vr3(n) can be expressed as Vr3(n)=Vr2(n)−q(n+1). If VFS is a full-scale voltage, then the weight qn of the n-th bit is expressed as, $$qn=VFS\cdot 2^{-n}$$

Reverting to FIG. 6, with the clock (2) in this case, the second reference voltage Vr2 becomes 5VFS/8, the first reference voltage Vr1 becomes 5VFS/8+VFS/8=3VFS/4, and the third reference voltage Vr3 becomes 5VFS/8−VFS/8=VFS/2.

Due to the comparison by the comparators 11 to 13 at a timing t2, the input voltage Vin is decided to lie between the second reference voltage Vr2 and the third reference voltage Vr3. With the next clock (3), the output (9VFS/16) of the DA converter 3 corresponding to ("1001") obtained by adding a bit "1" having a weight of a bit (weight of the 4-th bit: VFS/16) next of the digital value ("100") determined with the preceding clock (2), is regarded to be the second reference voltage Vr2.

With the clock (3), the first reference voltage Vr1 becomes 9VFS/16+VFS/16=5VFS/8, and the third reference voltage Vr3 becomes 9VFS/16−VFS/16=VFS/2. By repeating the same processing, a digital value (output) "10010111" is obtained.

Next, described below with reference to FIG. 7 is a case where when the voltage Vin of the input analog signal gradually acquires a predetermined level with given rising characteristics, the input voltage Vin is compared by the comparators 11 to 13 on the way of rising like in the case of FIG. 4 described above.

With the first clock (1), the first reference voltage Vr1 is 3VFS/4, the second reference voltage Vr2 is VFS/2 and the third reference voltage Vr3 is VFS/4. The input voltage Vin at this moment is in the rising transition period. At the decision timing t1 of the comparators 11 to 13, the input voltage Vin assumes a level between the second reference voltage Vr2 and the third reference voltage Vr3. Therefore, the upper two bits become "01".

With the next clock (2), the first reference voltage Vr1 is VFS/2, the second reference voltage Vr2 is 3VFS/8 and the third reference voltage Vr3 is VFS/4. The input voltage Vin is still in the rising transition period and has a level larger than the first reference voltage Vr1 (=VFS/2). Therefore, the third bit becomes "1" ("011"). Here, discrepancy occurs from the result of decision in that the input voltage Vin at the above timing t1 is smaller than the second reference voltage Vr2 (=VFS/2) in the clock (1).

With the next clock (3), "1" is added to the upper three bits "011" at the third bit to correct the upper three bits to be "100", and the upper four bits to which the weight of the next bit (weight of the fourth bit: VFS/16) is added render the output (9VFS/16) of the DA converter 3 corresponding to "1001" to be the second reference voltage Vr2. Here, the first reference voltage Vr1 becomes 9VFS/16+VFS/16=5VFS/8 and the third reference voltage Vr3 becomes 9VFS/16−VFS/16=VFS/2.

Due to the decision of the comparator 11 to 13 at the timing t3 in the clock (3), the input voltage Vin is decided to lie between the first reference voltage Vr1 (=5VFS/8) and the second reference voltage Vr2 (=9VFS/16). Thereafter, the processing is conducted in the same manner as that of the normal case of FIG. 6.

As described above, when the input voltage Vin or the reference voltages Vr1 to Vr3 output from the DA converter 3 are not settled to a sufficient degree, or when an error occurs in the decision by the comparators 11 to 13 due to noise, the comparison/decision processing of at least two clocks is necessary for correcting the error. Further, the limit of error that can be corrected at the timing tn becomes ($½^{n+1}$)VFS. Within this range, the error can be corrected by the subsequent clocks.

An embodiment of the analog-to-digital converter according to the present invention will now be described in detail with reference to the accompanying drawings.

Figures 8A, 8B:
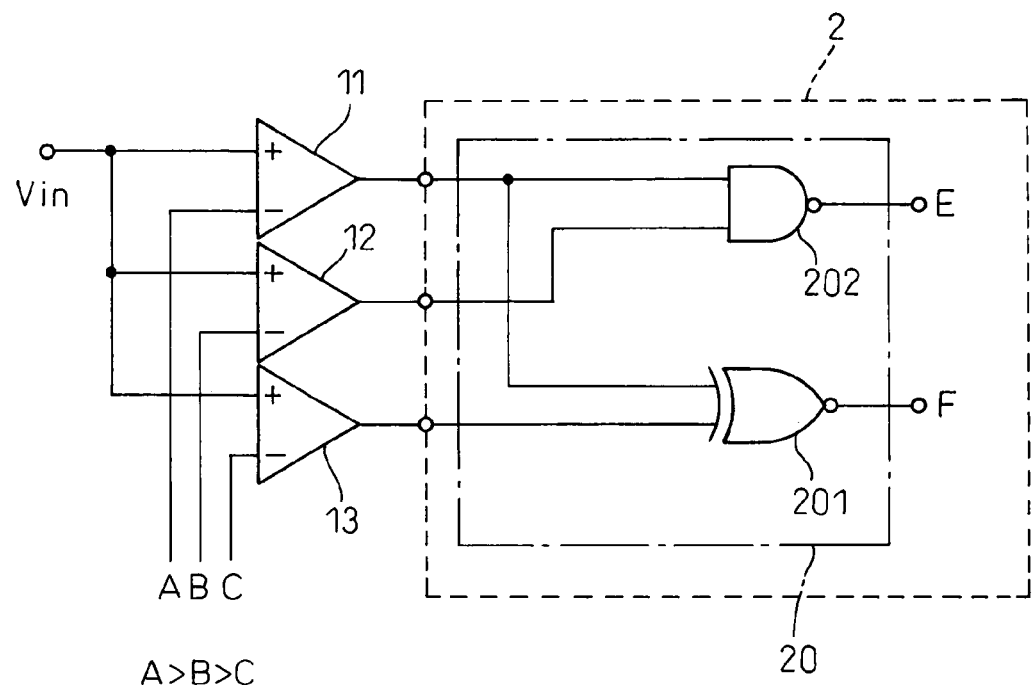
FIG. 8A is a circuit diagram illustrating the constitution of part of a first embodiment of the analog-to-digital converter of the present invention.
FIG. 8B is a diagram illustrating relationships of signal levels in the circuit of FIG. 8A.
Figure 9:
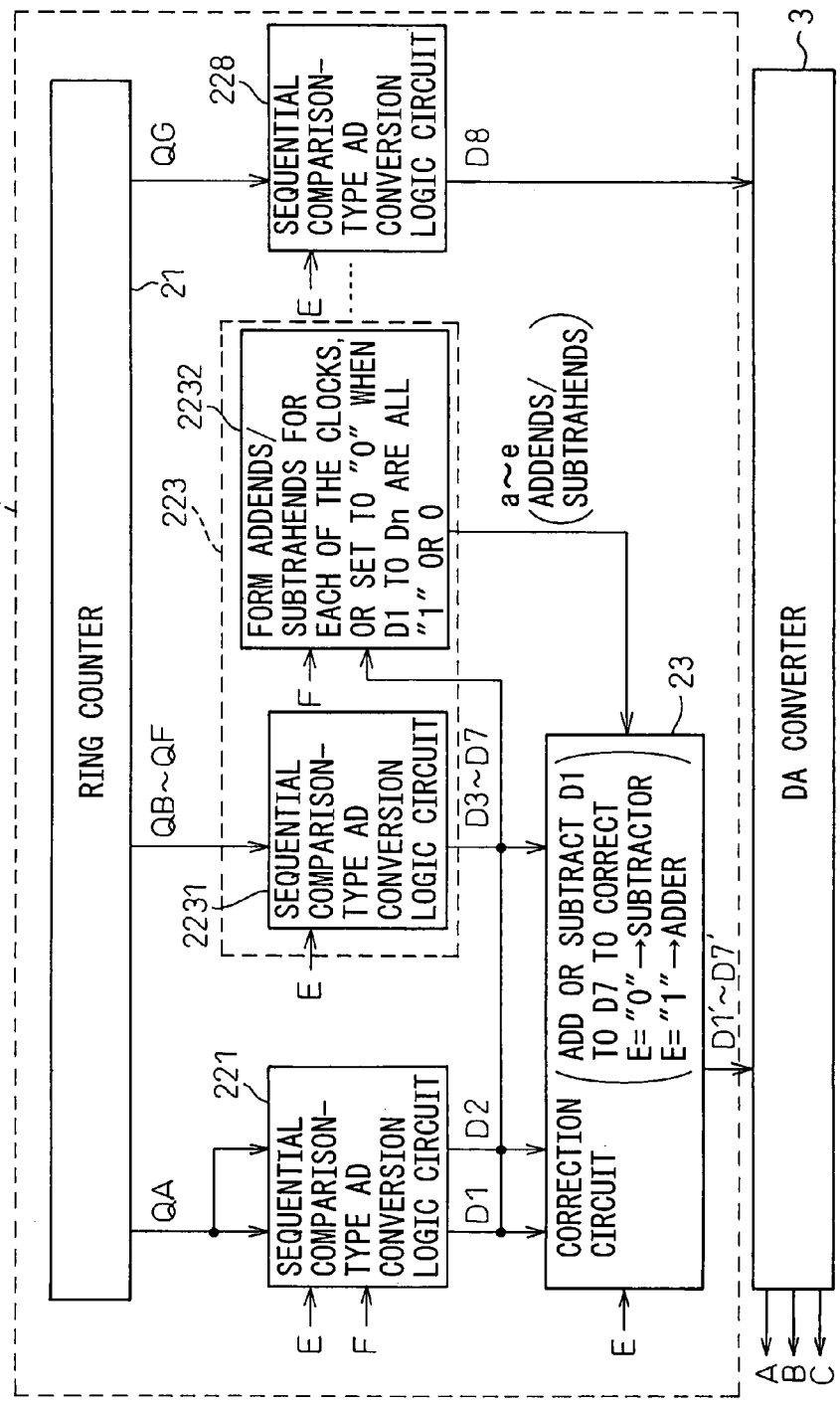
FIG. 9 is a block diagram illustrating the constitution of another part of the first embodiment of the analog-to-digital converter of the present invention.

FIG. 8A is a circuit diagram illustrating the constitution of part of a first embodiment of the analog-to-digital converter according to the present invention, FIG. 8B is a diagram illustrating relationships of signal levels in the circuit of FIG. 8A, and FIG. 9 is a block diagram illustrating the constitution of another part of the first embodiment of the analog-to-digital converter according to the present invention. That is, FIG. 8A and FIG. 9 in combination illustrate an embodiment corresponding to the AD converter of FIG. 5 described above.

In FIGS. 8A and 9, sign A denotes the reference voltage Vr1, sign B denotes the reference voltage Vr2 and sign C denotes the reference voltage Vr3. Signs E and F are signals obtained by subjecting the output signals of the three comparators 11 to 13 to the logical processing through a comparator output signal processing circuit 20 provided in the sequential comparison register and control logic circuit 2 as shown in FIG. 8A. The comparator output signal processing circuit 20 is constituted by an ExNOR gate 201 and a NAND gate 202.

That is, the comparator output signal processing circuit 20 substitutes, for the signals [E,F] of two bits, the result of comparison of input signal Vin with reference voltage A (Vr1) by the first comparator 11, the result of comparison of input signal Vin with reference voltage B (Vr2) by the second comparator 12, and the result of comparison of input signal Vin with reference voltage C (Vr3) by the third comparator 13.

Concretely, as shown in FIG. 8B, when the results of comparison of the comparators 11 to 13 are [0, 0, 0], [0, 0, 1], [0, 1, 1] and [1, 1, 1], the signals [E, F] change into [1, 1], [1, 0], [0, 0] and [0, 1], respectively.

That is, when, for example, the result of comparison of the input signal Vin with the reference voltage A by the first comparator 11 is "1", it means that the input signal Vin is larger than the reference voltage A (Vin is higher: Vin>A). Further, when the result of comparison of the input signal Vin with the reference voltage A by the first comparator 11 is "0", it means that the input signal Vin is smaller than the reference voltage A (Vin is lower: Vin<A).

Here, among the three reference voltages A(Vr1), B(Vr2) and C(Vr3), the first reference voltage A is larger than the second reference voltage B by a predetermined level (e.g., by the weight of the next bit), and the third reference voltage C is smaller than the second reference voltage B by the predetermined level. Namely, a relationship A>B>C is holding among the reference voltages.

In the comparison of the input signal Vin with the reference voltages A to C holding the relationship A>B>C by the comparators 11 to 13, there do not occur such results of comparison as, for example, [1, 0, 0], [0, 1, 0], [1, 1, 0] and [1, 0, 1]. That is, the result of comparison [1, 0, 0] by the comparators 11 to 13 stands for that Vin>A, Vin<B and Vin<C which, however, is contradictory to A>B>C.

This is a case where a condition that would not occur appears due, for example, to difference in the offset of the three comparators 11 to 13 stemming from the dispersion in the production of semiconductors or due to noise in subjecting the input analog signals to the AD conversion maintaining a very high resolution or in effecting the comparison of the least significant bits or in a high resolution region close thereto.

When the results of comparison that would not occur are obtained, the bit data of the three comparators 11 to 13 are not taken into consideration (are not used as bit data obtained from input analog signals through the AD conversion), and only the output of the comparator 12 that makes comparison with the second reference voltage B is used to determine the subsequent lower bits. Concretely, in the case of the patterns other than the results of comparison of A, B and C shown in FIG. 8B, the output of F is set to be "0" to realize.

Referring to FIG. 9, the sequential comparison resister and control logic circuit 2 includes sequential comparison-type AD conversion logic circuits 221 and 223 to 228 which receive signals E and F which are logically processed by the comparator output signal processing circuit 20 described with reference to FIG. 8A, feed digital signals to the DA converter 3 to form reference voltages A, B and C, and produce input voltages (input analog signals) Vin as AD-converted digital values, and a correction circuit 23. Here, the sequential comparison-type AD conversion logic circuit 221 is for forming digital signals D1 and D2 of the most significant (MSB) and of the second bit, the sequential comparison-type AD conversion logic circuits 223 to 227 are for forming digital signals D3 to D7 of the intermediate bits of from the third bit to the seventh bit, and the sequential comparison-type AD conversion logic circuit 228 is for forming a digital signal D8 of the least significant bit (LSB: eighth bit).

Figure 10:
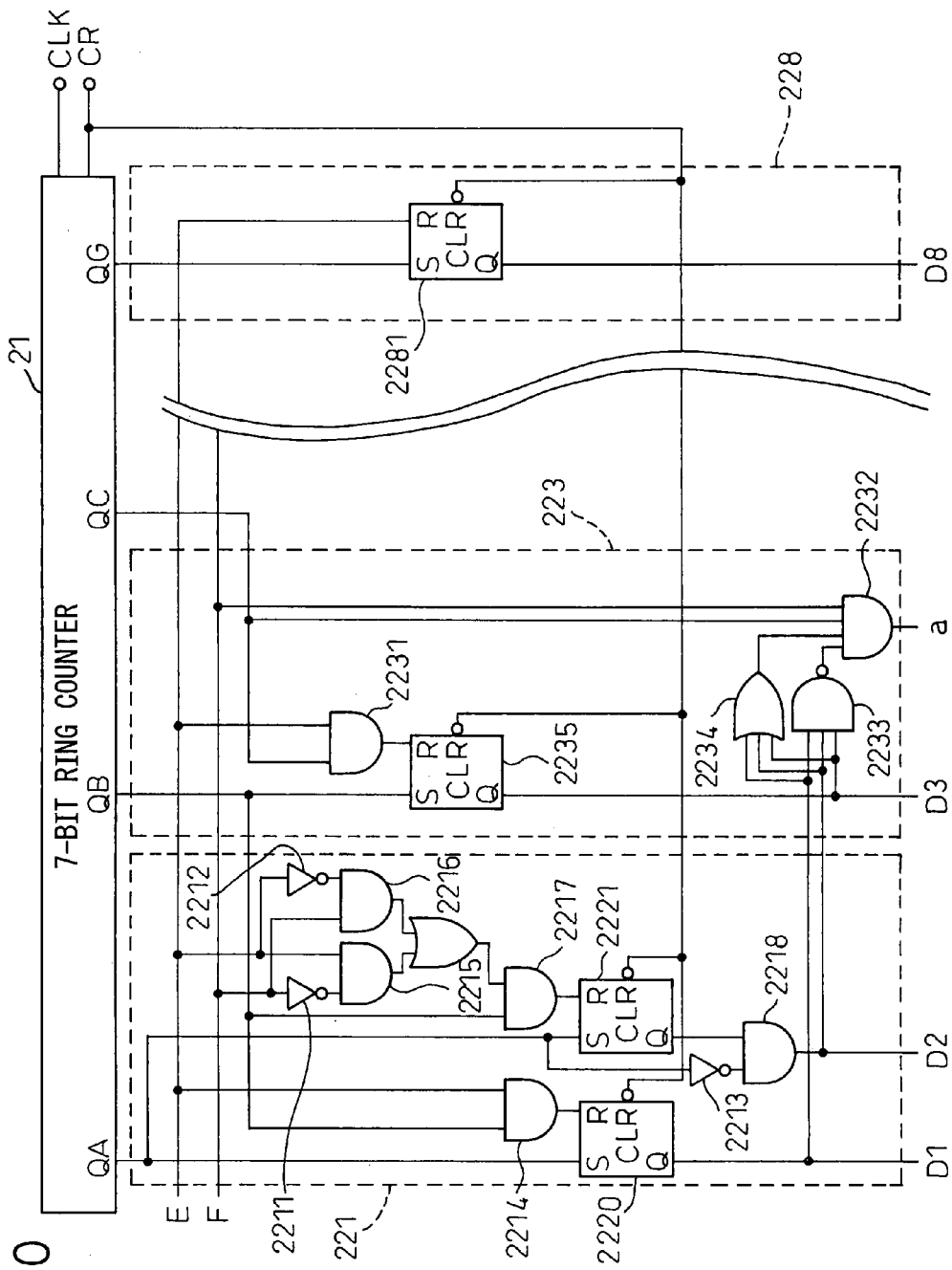
FIG. 10 is a circuit diagram illustrating the constitution of major portions of the analog-to-digital converter shown in FIG. 9.
Figures 11A, 11B:
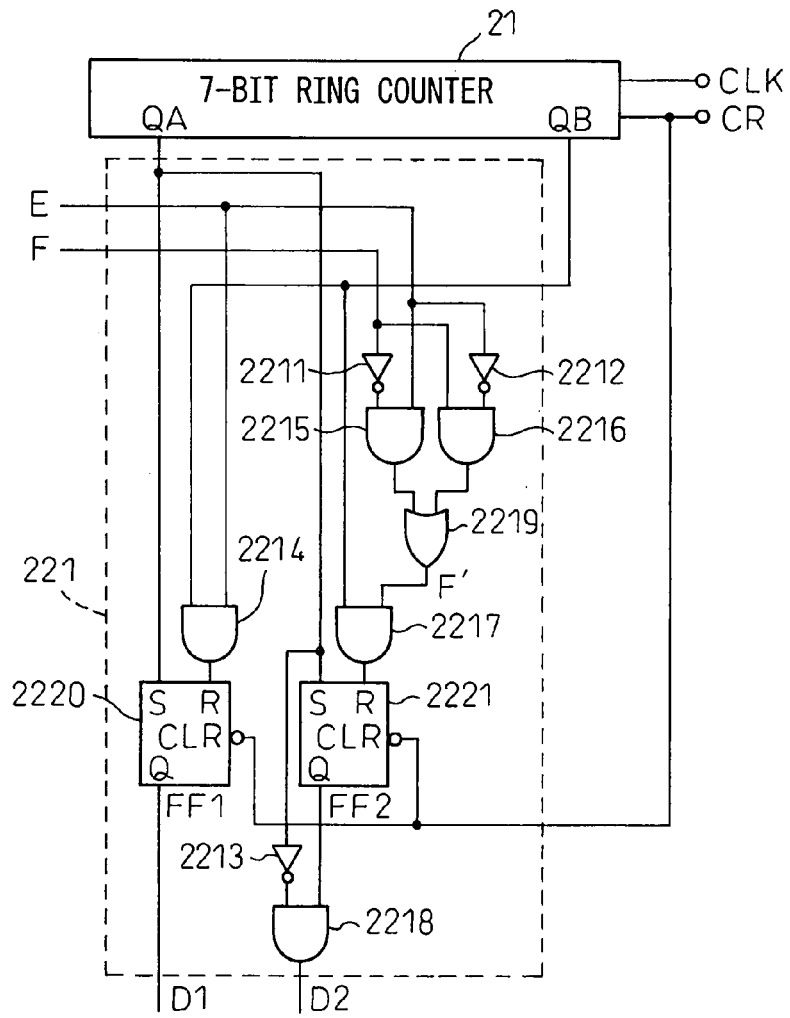
FIGS. 11A and 11B are diagrams for illustrating the determination of logic of the upper two bits in the circuit shown in FIG. 10.
Figures 12A, 12B:
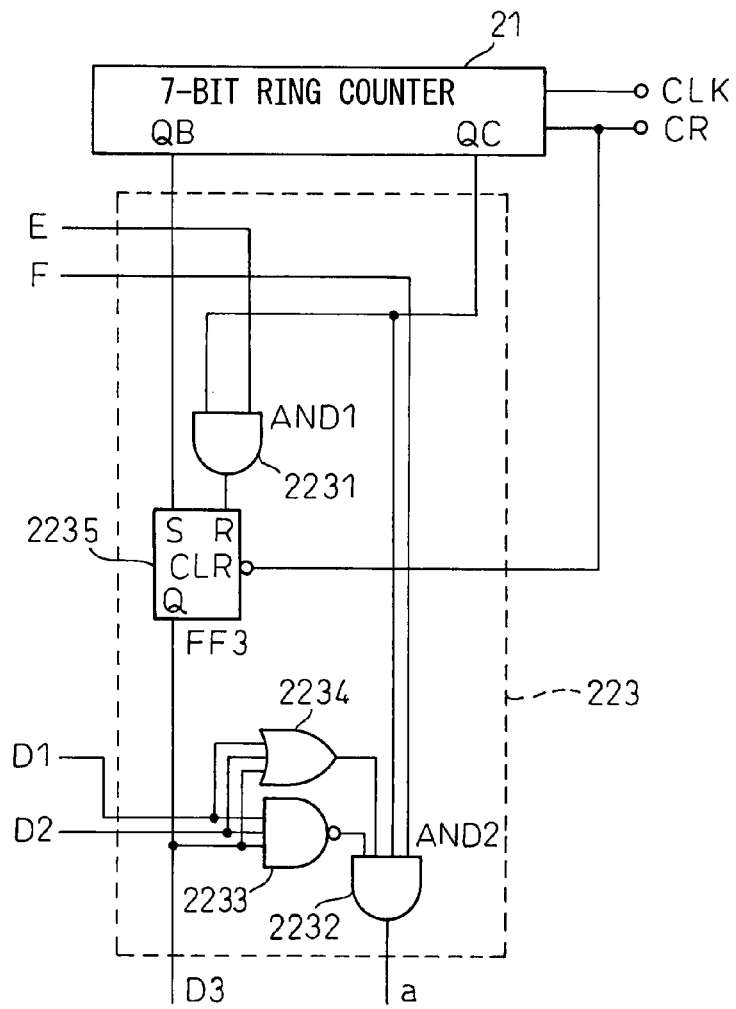
FIGS. 12A and 12B are diagrams for illustrating the determination of logic of the intermediate bits in the circuit shown in FIG. 10.
Figure 13:
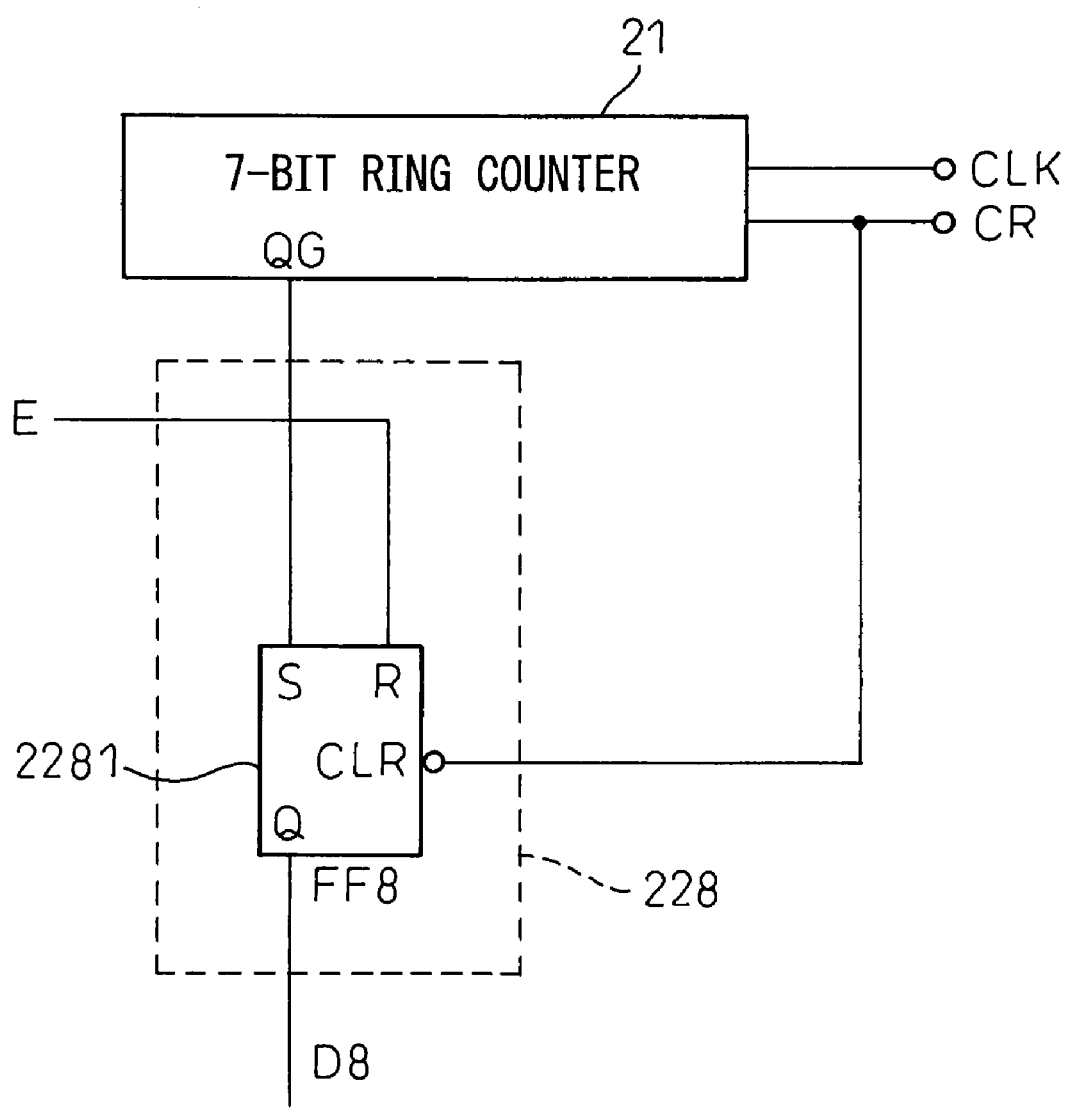
FIG. 13 is a diagram for illustrating the determination of logic of the least significant bit in the circuit shown in FIG. 10.

FIG. 10 is a circuit diagram illustrating the constitution of major portions of the analog-to-digital converter shown in FIG. 9, FIGS. 11A and 11B are diagrams for illustrating the determination of logic of upper two bits in the circuit shown in FIG. 10, FIGS. 12A and 12B are diagrams for illustrating the determination of logic of intermediate bits in the circuit shown in FIG. 10, and FIG. 13 is a diagram for illustrating the determination of logic of the least significant bit in the circuit shown in FIG. 10.

First, as shown in FIG. 10 and FIG. 11A, the sequential comparison-type AD conversion logic circuit 221 for forming digital signals D1 and D2 which are the MSB and the second bit (upper two bits) is constituted by inverters 2211 to 2213, AND gates 2214 to 2218, OR gate 2219, and SR flip-flops 2220, 2221, receives output signals QA, QB of the 7-bit ring counter 21 as well as signals E, F described with reference to FIGS. 8A and 8B, and forms digital signals D1, D2 which are the upper two bits.

Here, the 7-bit ring counter 21 receives a clock signal CLK and a clear signal CR, and sends counter outputs QA to QG (corresponds to clocks (1) to (7)) to the sequential comparison-type AD conversion logic circuits 221 to 228.

Concerning the digital signals D1 and D2 which are the upper two bits as shown in FIG. 11B, if the signals [E, F] vary like [1, 1], [1, 0], [0, 0] and [0, 1] in response to the results of comparison of the comparators 11 to 13, the output signal F' of the OR gate 2219 varies like [1], [0], [1] and [0], and whereby the digital signal D1 which is the MSB or the Q-output of the SR flip-flop 2220 and the digital signal D2 which is the second bit output from the AND gate 2218 (digital signals D1, D2) vary like [0, 0], [0, 1], [1, 0] and [1, 1].

Next, as shown in FIG. 10 and FIG. 12A, the sequential comparison-type AD conversion logic circuit 223 (223 to 227) for forming digital signals D3 to D7 which are the intermediate bits (third bit to seventh bit) are constituted by inverter AND gates 2231, 2232, NAND gate 2233, OR gate 2234, and SR flip-flop 2235, receive output signals QB, QC of the 7-bit ring counter 21 as well as signals E, F and digital signals D1, D2, and form digital signals D3 (D3 to D7) which are the intermediate bits.

Concerning the digital signals D3 which are the intermediate bits as shown in FIG. 12B, if the signals [E, F] vary like [1, 1], [1, 0], [0, 0] and [0, 1] in response to the results of comparison of the comparators 11 to 13, the digital signal D3 which is the third bit of the SR flip-flop 2235 and the signal a for correcting the logic (digital signals D3, a) vary like [0, 1], [0, 0], [1, 0] and [1, 1].

The sequential comparison-type AD conversion logic circuit 228 for forming a digital signal D8 which is the least significant bit (LSB: eighth bit) is constituted by simply the SR flip-flop 2281 as shown in FIGS. 10 and 13 since the digital signal D8 does not affect signals of any other bits, and receives the output signal QG of the 7-bit ring counter 21 and the signal E, and forms the digital signal D8 which is the LSB.

Figure 14:
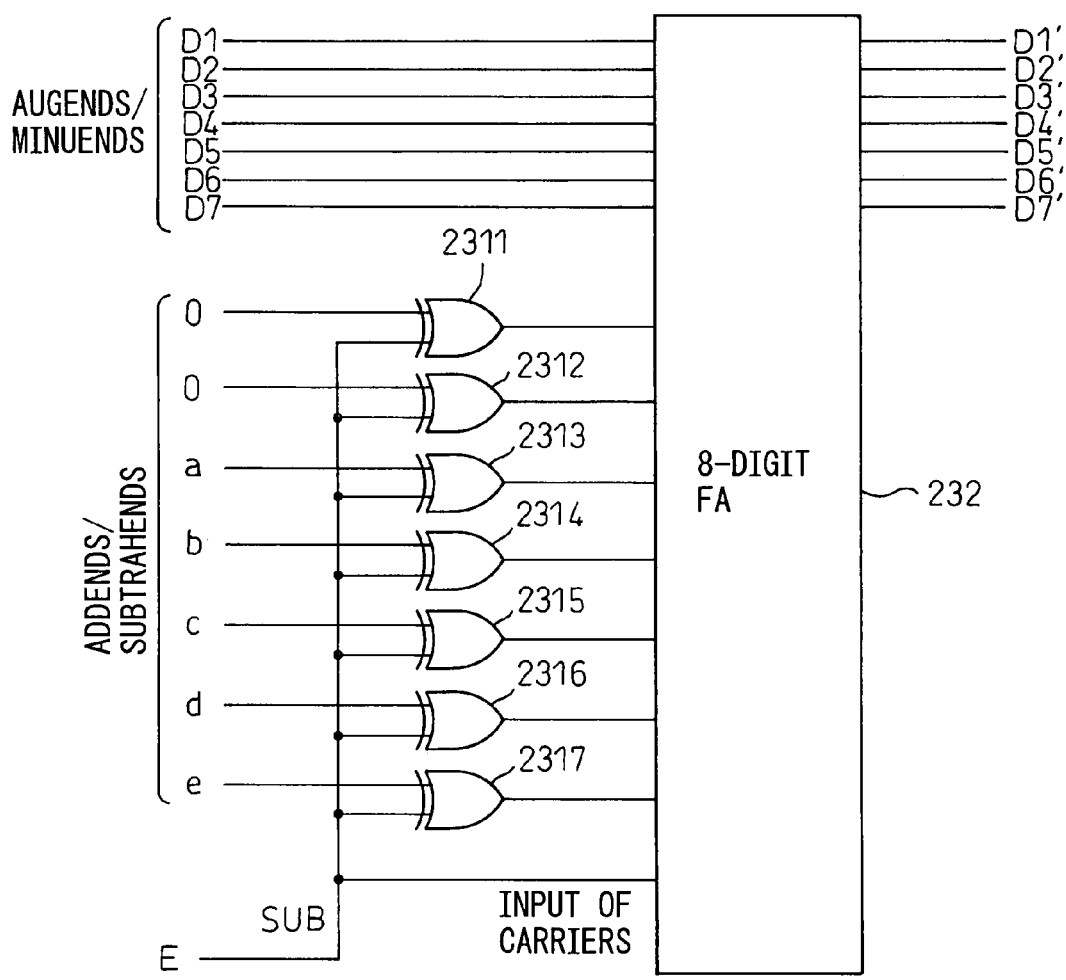
FIG. 14 is a circuit diagram illustrating a correction circuit in the analog-to-digital converter shown in FIG. 9.

FIG. 14 is a circuit diagram illustrating the correction circuit 23 in the analog-to-digital converter shown in FIG. 9.

As shown in FIG. 14, the correction circuit 23 is constituted by exclusive OR (EOR) gates 2311 to 2317 and an 8-bit full adder 232. Here, a signal "0" is input to the input terminals on one side of the EOR gates 2311 and 2312 for the upper two bits, and correction signals a to e are input to the input terminals on one side of the EOR gates 2313 and 2317 for the third bit to the seventh bit. A signal E is input to the input terminals on the other side of the EOR gates 2311 to 2317. If the signal E is "1", addends/subtrahends [0, 0, a, b, c, d, e] are added to the augends/minuends [D1, D2, D3, D4, D5, D6, D7]. If the signal E is "0", addends/subtrahends [0, 0, a, b, c, d, e] are subtracted from the augends/minuends [D1, D2, D3, D4, D5, D6, D7].

Figure 15:
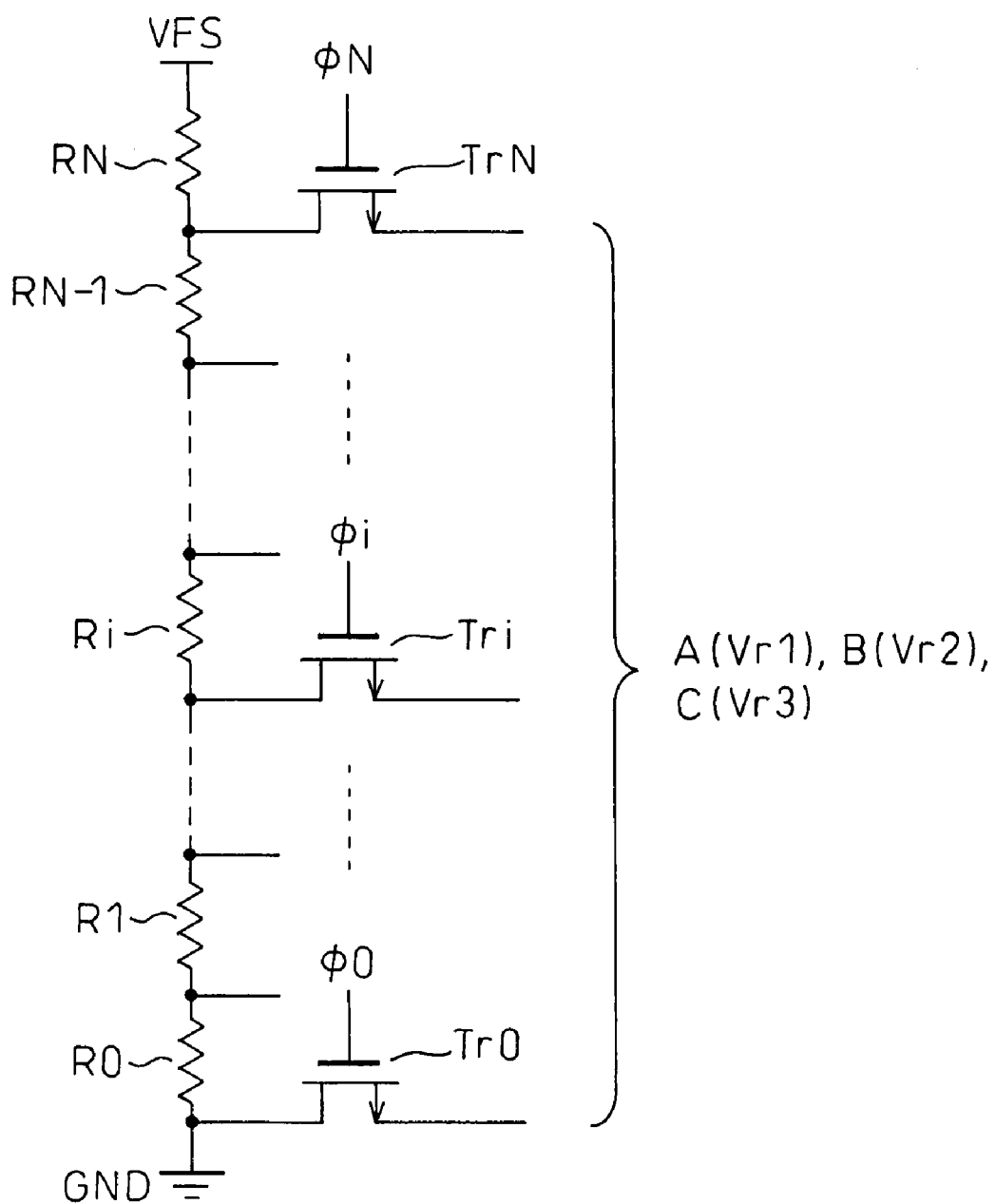
FIG. 15 is a circuit diagram illustrating a DA converter in the analog-to-digital converter shown in FIG. 9.

FIG. 15 is a circuit diagram illustrating the DA converter 3 in the analog-to-digital converter shown in FIG. 9, and shows the DA converter of the resistor string type.

The DA converter of the resistor string type as shown in FIG. 13 has a plurality of resistors that are connected in series between the power source line (full-scale voltage VFS) and ground, and produces analog voltages through transistors (MOS switches) Tr0 to TrN which receive, through gates thereof, digital signals from the connection nodes among the resistors.

Concretely, with, for example, the first clock (1) shown in FIG. 6, three predetermined transistors forming voltages 3VFS/4, VFS/2 and VFS/4 are selected, and analog signals A (Vr1=VFS/4), B (Vr2=VFS/2) and C (Vr3=VFS/4) are input to the input terminals on one side of the three comparators 11 to 13 shown in FIG. 8A.

Figure 16:
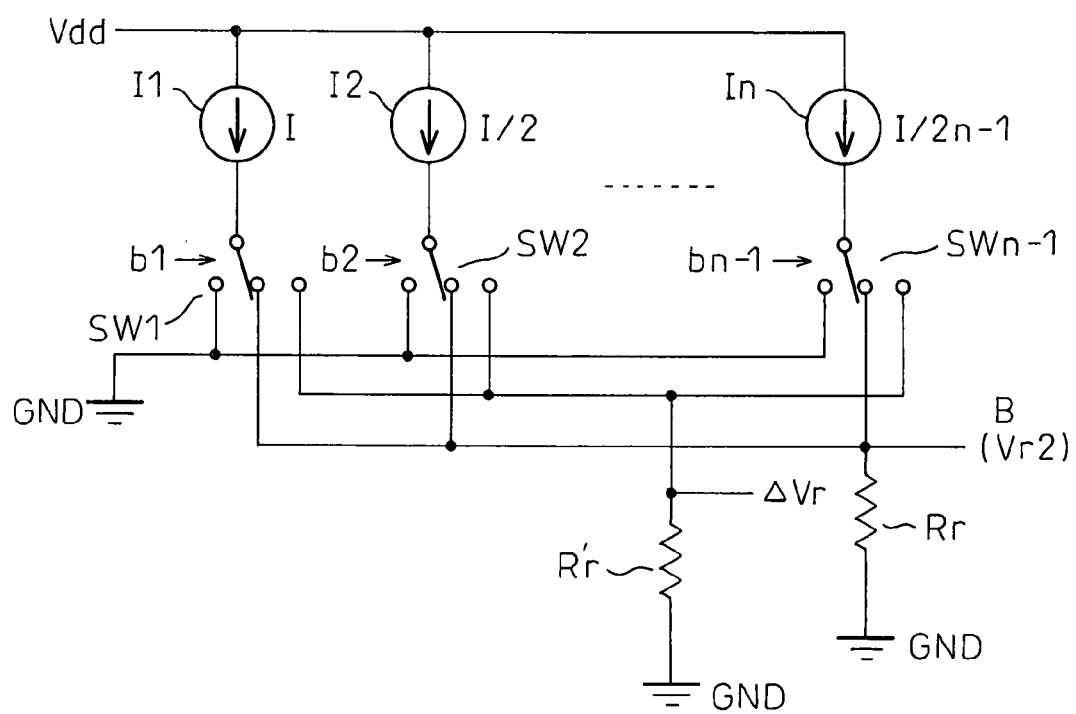
FIG. 16 is a circuit diagram illustrating another DA converter in the analog-to-digital converter shown in FIG. 9.

FIG. 16 is a circuit diagram illustrating another DA converter 3 in the analog-to-digital converter shown in FIG. 9, and shows the DA converter comprising a binary-coded weighted current source. FIG. 17 is a circuit diagram illustrating a modified example of the comparator in the analog-to-digital converter shown in FIG. 8A.

Referring to FIG. 16, the DA converter 3 which is the binary-coded weighted current source selects the current sources I1 to In of the number of n forming currents I, I/2, I/4, I/8, - - - , I/$2^2$ by using switches SW1 to SWn−1 in response to digital signals (b1 to bn−1) input to the DA converter 3, and flows an electric current to a resistor Rr to thereby form a reference voltage B (second reference voltage Vr2) as well as to form a differential voltage (differential analog signal) ΔVr having the weight of the next bit, and feeds them to the first to third comparators 11 to 13 shown in FIG. 17.

Here, the resistor Rr for forming the reference voltage B and the resistor Rr' for forming the differential voltage ΔVr have the same resistance. Further, the first comparator 11 has one positive input and two negative inputs, the second comparator 12 has one negative input and one positive input, and the third comparator 13 has two positive inputs and one negative input.

Concretely, with the first clock (1) in FIG. 6 described above, the DA converter 3 forms the reference voltage B (second reference voltage Vr2) with which the voltage (potential across both terminals of the resistor Rr) becomes VFS/2 and the differential voltage ΔVr which is the voltage (potential difference across both terminals of the resistor Rr') of the weight of a bit next of VFS/4.

The input analog signal (input voltage) Vin is input to the one positive input terminal of each of the first to third comparators 11 to 13, and the reference voltage B (second reference voltage Vr2) is input to the one negative input terminal of each of them. Further, the differential voltage ΔVr is input to the other input terminal of the first comparator 11, a voltage (first reference voltage A (=B+ΔVr)) obtained by adding the differential voltage ΔVr to the reference voltage B is compared with the input voltage Vin, the differential voltage ΔVr is input to the other positive input terminal of the third comparator 13, and a voltage (third reference voltage C (=B−ΔVr)) obtained by subtracting the differential voltage ΔVr from the reference voltage B is compared with the input voltage Vin.

The DA converter of the resistor string type which is the above-mentioned DA converter 3 and the DA converter which is the binary-coded weighted current source, are simply some of the examples, and the DA converters of any other constitutions can also be used. Further, the sequential comparison-type AD conversion logic circuits 221 to 228 and the correction circuit 23, too, are simply some of the examples, and various other circuit constitutions can also be used, as a matter of course.

Further, the above embodiment has dealt with the cases of AD-converted digital values of 8 bits which, however, are simply for explanation. In practice, the digital values of 10 to 14 bits or more bits can be used. Further, the above circuits in the drawings are simply for explanation, and various modifications may be effected, as a matter of course, such as inverting the logics of the signals or employing other logic gates and transistors.

As described above in detail, the preset invention provides a sequential comparison-type AD converter capable of operating at a high speed. The invention, further, makes it possible to realize the AD converter in a small size by increasing the allowance of process fluctuation and relative dispersion of elements.

The sequential comparison-type AD converter of the invention can be used in a variety of applications such as personal computers, digital still cameras and in engine control systems for automobiles, and can be particularly desirably used for the AD converter which must meet the requirements of operation at high speeds yet maintaining a small size.

Many different embodiments of the present invention may be constructed without departing from the scope of the present invention, and it should be understood that the present invention is not limited to the specific embodiments described in this specification, except as defined in the appended claims.

What is claimed is:

1. The analog-to-digital converter comprising:
   a digital-to-analog converter producing analog signals and forming first, second, and third analog signals which are different from each other;
   first, second and third comparators comparing the input analog signal with said first analog signal, greater than said second analog signal by a predetermined level, and said third analog signal, smaller than said second analog signal by said predetermined level; and
   a sequential comparison register and control logic circuit which controls the digital signals that are fed to said digital-to-analog converter from said first to third comparators, and outputs said digital signals as digital values obtained by subjecting said input analog signals to the analog-to-digital conversion.

2. The analog-to-digital converter as claimed in claim 1, wherein said predetermined level is a voltage level one-half the weight of the bit of a digital signal applied to said digital-to-analog converter.

3. An analog-to-digital converter, comprising:
   a digital-to-analog converter producing analog signals;
   first, second and third comparators comparing the input analog signal with first, second and third analog signals, which are different from each other, said digital-to-analog converter forming said second analog signal and a differential analog signal of a voltage level one-half the weight of the bit of a digital signal applied to said digital-to-analog converter at the time of forming said second analog signal; and
   a sequential comparison register and control logic circuit which controls the digital signals that are fed to said digital-to-analog converter from said first to third comparators, and outputs said digital signals as digital values obtained by subjecting said input analog signals to the analog-to-digital conversion.

4. The analog-to-digital converter as claimed in claim 3, wherein: said first comparator compares a signal obtained by adding said differential analog signal to said second analog signal with said input analog signal; said second comparator compares said second analog signal with said input analog signal; and said third comparator compares a signal obtained by subtracting said differential analog signal from said second analog signal with said input analog signal.

5. The analog-to-digital converter as claimed in claim 1, wherein said sequential comparison register and control logic circuit further includes a comparator output signal processing circuit which processes the output signals of said first to third comparators to convert them into signals of 2 bits.

6. The analog-to-digital converter as claimed in claim 1, wherein said sequential comparison register and control logic circuit further includes: a ring counter counting clock signals and outputting a count signal; and a sequential comparison-type AD conversion logic circuit which receives output signals from said first to third comparators and an output signal from said ring counter, and forms a digital signal to be fed to said digital-to-analog converter.

7. The analog-to-digital converter as claimed in claim 6, wherein said sequential comparison-type AD conversion logic circuit includes: an AD conversion logic circuit sequentially comparing the upper two bits that specify the digital signals of the upper two bits; an AD conversion logic circuit sequentially comparing the intermediate bits that specify the digital signals of the intermediate bits of the third and subsequent bits but one bit before the least significant bit; and an AD conversion logic circuit sequentially comparing the least significant bits that specify the digital signals of the least significant bits.

8. The analog-to-digital converter as claimed in claim 7, wherein said sequential comparison-type register and control logic circuit further includes a correction circuit which corrects said digital signals by using the digital signals of the upper two bits formed by said AD conversion logic circuit sequentially comparing said upper two bits, by using the digital signals of the intermediate bits formed by said AD conversion logic circuit sequentially comparing said intermediate bits, and by using the digital signals for correction.

* * * * *

UNITED STATES PATENT AND TRADEMARK OFFICE
CERTIFICATE OF CORRECTION

PATENT NO. : 7,561,094 B2
APPLICATION NO. : 11/889620
DATED : July 14, 2009
INVENTOR(S) : Masao Hotta et al.

Page 1 of 1

It is certified that error appears in the above-identified patent and that said Letters Patent is hereby corrected as shown below:

Column 11, Line 28, change "The" to --An--.

Column 11, Line 28, change "converter" to --converter,--.

Signed and Sealed this

Third Day of November, 2009

David J. Kappos
*Director of the United States Patent and Trademark Office*